United States Patent
Pietrzyk

[11] Patent Number: 6,008,700
[45] Date of Patent: Dec. 28, 1999

[54] SWITCHABLE FREQUENCY RING OSCILLATOR

[75] Inventor: Michael Pietrzyk, Hamburg, Germany

[73] Assignee: U.S. Philips Corporation, New York, N.Y.

[21] Appl. No.: 09/111,560

[22] Filed: Jul. 8, 1998

[30] Foreign Application Priority Data

Aug. 23, 1997 [DE] Germany .......................... 197 36 857

[51] Int. Cl.[6] .................................................. H03B 5/02
[52] U.S. Cl. ................. 331/45; 331/57; 331/179
[58] Field of Search ................................ 331/57, 45, 179

[56] References Cited

U.S. PATENT DOCUMENTS

| | | | |
|---|---|---|---|
| 4,105,950 | 8/1978 | Dingwall | 331/57 |
| 4,517,532 | 5/1985 | Neidorff | 331/57 |
| 5,592,126 | 1/1997 | Boudewijns et al. | 331/57 |
| 5,592,127 | 1/1997 | Mizuno | 331/57 |

*Primary Examiner*—Siegfried H. Grimm
*Attorney, Agent, or Firm*—Edward W. Goodman

[57] ABSTRACT

In digital signal processing, it is necessary to work with system clocks. This often requires the use of different system clocks which have a corresponding accuracy. In a ring oscillator circuit having an even number of ring inverters caused to oscillate by the same number of shunt inverters, a stepwise change of the frequency is achieved by switching additional inverters. By switching between two modes, several multiples of a fundamental frequency can be adjusted. By merely switching the additional inverters, the current consumption at each adjusted frequency remains constant. This has the advantage that the frequency thus generated is very stable and, hence, corresponds to the accuracy requirements imposed on digital signal processing. Moreover, this system is operated via a current supply so that a further improvement of the accuracy and freedom from interference of the generated frequencies is achieved. The use of inverters operating with MOSFETs is possible because these ring oscillators are integrable and can thus be combined to complex circuits in digital signal processing. The number of phases of the ring oscillator determines the gradation of the individual frequencies. The higher the number of phases, which must be a multiple of four, the more gradations can be obtained.

5 Claims, 3 Drawing Sheets

SWITCHABLE FREQUENCY RING OSCILLATOR

BACKGROUND OF THE INVENTION

1. Field of the Invention

The invention relates to a ring oscillator.

Such circuits are particularly used for generating system clocks. Oscillators are known in which an odd number of inverters is combined to a ring. This oscillator type is not frequency-variable.

2. Description of the Related Art

EP 0 633 662 A1 describes a circuit arrangement for a ring oscillator comprising a first and a second series circuit of n driver stages combined to a ring. Hold stages are arranged between the driver stages. A frequency is generated with this circuit arrangement, and interleaved, particularly complementary signals are derived from the separate connections.

SUMMARY OF THE INVENTION

It is an object of the invention to change the oscillator-generated frequencies stepwise without a change of current consumption.

This object is solved by a stepwise frequency-variable ring oscillator, comprising an even number of ring inverter pairs combined to a ring, in which the input of each individual ring inverter conveys a phase-shifted signal at a signal point, the phase shift with respect to the signal at the previous signal point results from the quotient of 360° by the number of ring inverters, and the ring inverters, whose input signals are phase-shifted by 180° with respect to each other, constitute a ring inverter pair, the same even number of shunt inverter pairs, in which each shunt inverter pair is assigned to a ring inverter pair and the assigned shunt inverter pair feeds back the output signals of the ring inverters to the respective other output of the ring inverter associated with the pair, the same even number of slope inverter pairs, in which each slope inverter pair is assigned to a pair of ring inverters and to the signal points constituting their inputs, the inputs of the slope inverters are alternately connected in two modes to a respective one of said signal points, and the outputs of the slope inverters are fixedly connected to signal points which, with reference to the signal points at the input of each slope inverter, have a phase shift of 90°, in one of the modes, referred to as "in-phase", a phase shift of 90° in the positive (leading) direction occurs between the input and the output of each slope inverter, and in a second mode, referred to as "anti-phase", a phase shift of 90° occurs in the negative (lagging) direction between the input and the output of each slope inverter.

Ring oscillators comprising an even number of ring inverters do not oscillate and, therefore, the ring oscillator is caused to oscillate by means of shunt inverters. The ring inverters are arranged in a row and the output of the last ring inverter in the row is fed back to the input of the first ring inverter. The signal present at each signal point is fed back with a phase shift of 180° via the shunt inverters to a signal point, thus exciting the oscillation. Similarly as the other inverters mentioned above, the slope inverters are realized with MOSFETs.

Since digital circuits require different system clocks, which can be realized by varying the oscillator frequency, a stepwise change of the oscillator frequency can be achieved by switching the slope inverters. If inverters were merely added, the problem would arise that each added inverter would increase the current consumption and thus produce voltage peaks which would affect the frequency. By switching the slope inverters, the same number of inverters in the circuit is always active and the current consumption remains constant.

A further advantage of this circuit is its integrability. External oscillators can thus be integrated in existing circuits while saving space and material.

When all slope inverters are switched to the anti-phase mode, the smallest frequency is achieved because the signals to be summed have opposite phases and the steepness or slope and thus also the frequency is reduced. The more pairs of slope inverters are switched to the in-phase mode with respect to the ring inverters, the higher the frequency.

The ratio of the frequency change is adjustable by the channel width ratio of the MOSFETs of the ring inverters with respect to the slope inverters. The inverters have different slopes due to the different channel widths of the transistors, so that the slope of the resultant signal increases or is reduced, dependent on the mode. In this case, the ring inverters associated with a pair have a fixed channel width ratio with respect to the two slope inverters assigned to this ring inverter pair. If the channel width ratio for all ring inverter pairs is equal with respect to the assigned slope inverters, the number of adjustable frequencies is obtained as the sum of half the phases of the ring oscillator plus one, the one being the frequency at which all slope inverter pairs are switched in opposite phase. The individual ring inverter pairs can also be operated at different channel width ratios with respect to the respective associated slope inverter pairs. If each pair of two ring inverters and the associated two slope inverters has a different channel width ratio, the number of adjustable frequencies is obtained as the $n^{th}$ power of two, in which n is the number of ring inverter pairs.

As system clocks require a great accuracy and freedom from interference, the ring oscillator according to the invention is fed with a current with which a power supply modulation can be suppressed so that the frequency is maintained constant.

Such oscillators can be formed with 4, 8, 12, 16, etc., ring inverters by which the number of phases is determined. Simultaneously, the number of phase-shifted signals or the number of signal points is fixed. In all embodiments, the current consumption is always the same because the number of inverters being actively engaged in the ring oscillator is always the same. With an increasing number of phases, the number of adjustable frequencies also increases.

Besides the method of switching the slope inverters statically, it is possible to switch them in an alternating mode.

Further medium frequencies can be achieved by changing the keying ratio or the switching frequency for the switches.

These and other aspects of the invention are apparent fro <be elucidated with reference to the embodiments described hereinafter.

DESCRIPTION OF THE PREFERRED EMBODIMENTS

Figure 1:
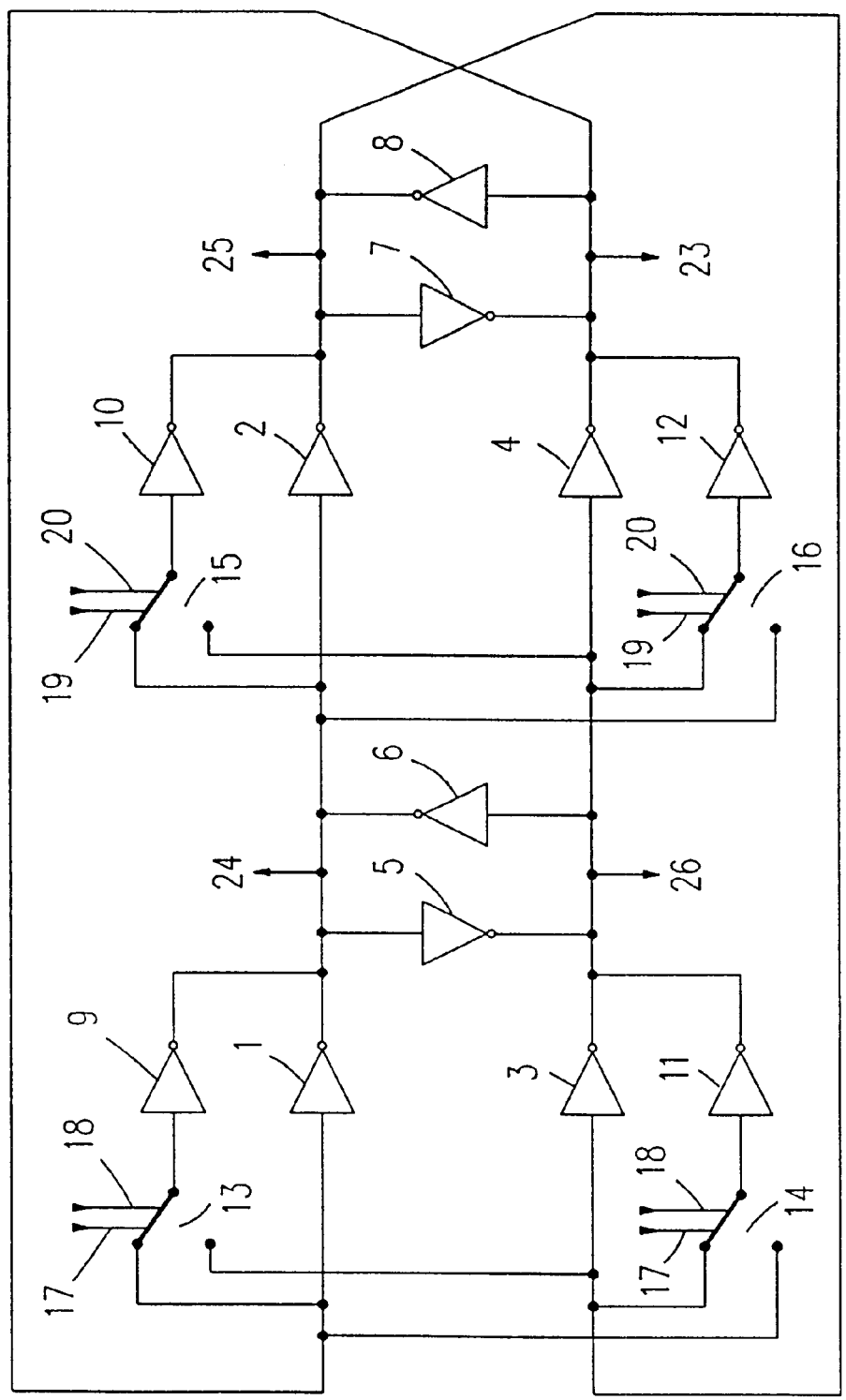
FIG. 1 shows a circuit arrangement of a four-phase ring oscillator.

The circuit arrangement in FIG. 1 shows the structure of a four-phase ring oscillator. A four-phase ring oscillator has four different output signals, all of which are phase-shifted by 90° with respect to each other and are taken from the signal points 23, 24, 25, 26. At least three, and a maximum of four, different frequencies can be adjusted.

The four-phase ring oscillator shown in FIG. 1 comprises the four ring inverters 1, 2, 3, 4 which are arranged to form a ring. Between these ring inverters 1, 2, 3, 4, shunt inverters 5, 6, 7, 8 are arranged in such a way that they cause this ring, consisting of the even number of ring inverters, to oscillate. Dependent on the mode, four slope inverters 9, 10, 11, 12 are switchable via switches 13, 14, 15, 16 by means of switching signals 17, 18, 19 and 20 at corresponding signal points 23, 24, 25, 26. In this arrangement, the ring inverters 1 and 3 constitute a pair to which the shunt inverters 5 and 6 and the slope inverters 9 and 11 are assigned. The inputs of the ring inverter pair 1 and 3 are connected to the signal points 23 and 25, respectively. In this simplest case, the outputs of the slope inverters 9 and 11 are also connected to the outputs of the ring inverters 1 and 3 and to the signal points 24, 26. Ring inverters 2 and 4, the associated shunt inverters 7 and 8 and the slope inverters 10 and 12, with the signal points 24, 26 for the inputs of the ring inverters 2 and 4 and the slope inverters 10 and 12 and the signal points 23 and 25 to which the outputs of said slope and ring inverters are connected, constitute the other pair.

The signal at the signal point 24 is fed back via the shunt inverter 5 to the signal point 26, because the signal is present at this point with a phase shift of 180° with respect to the signal point 24, and the signal at the signal point 26 is fed back to the signal point 24 via the shunt inverter 6. Similarly, the signal points 25 and 23 are interconnected. Dependent on the switching signal, the slope inverter pairs are switched to the "in-phase" or "anti-phase" mode with respect to the relevant ring inverter pair.

The two modes and their function will be explained, by way of example, with reference to ring inverters 1 and 3. The signal from signal point 23 is the input signal for ring inverter 1, and the signal from signal point 25 is the input signal for ring inverter 3. These signal points have a phase shift of 180° with respect to each other. If the frequency of the ring oscillator is increased, the slope inverters 9 and 11 associated with the ring inverters 1 and 3 are simultaneously switched from the "anti-phase" mode to the "in-phase" mode. Since the two signals to be added are positively fed back at the signal point 24, the frequency increases.

The slope inverter 9 is switched in phase with respect to the ring inverter 1, because the signal point 24, which is connected to the output of the slope inverter 9, conveys a signal having a positive phase shift of 90° with respect to the signal point 23. The slope inverter 11 is switched in phase with respect to the ring inverter 3, because the signal point 26 conveys a signal having a positive phase shift of 90° with respect to the signal point 25.

In the case of anti-phase switching for reducing the frequency, the slope inverter 9 is assigned to the ring inverter 3. To this end, the slope inverter 9 is connected to the signal point 25 preceding the ring inverter 3. Since a phase shift of 180° occurs between the signal points 23 and 25, a phase shift of 270, viewed from the signal point 25, occurs at the output of the slope inverter 9 with respect to the signal point 24, this 270° phase shift also simultaneously representing a phase shift of 90° in the negative direction. For the other ring inverter 1 associated with this pair, the slope inverter 11 is assigned to this ring inverter in the case of anti-phase switching. To this end, the slope inverter 11 is connected to the signal point 23 preceding the ring inverter 1, because a negative phase shift of 90° occurs between the signal point 23 at the input of the inverters 1 and 11 concerned and the signal point 26 at the output of the slope inverter 11. The frequency decreases due to the opposite signals at the signal points in the case of anti-phase switching.

The slope inverters are always switched pair-wise between the modes. Switching of the slope inverters from "in-phase" to "anti-phase", and conversely, is effected via the switches 13, 14, 15, 16, the switches 13 and 14 being simultaneously operated via the switching signal 17 or 18 and the switches 15 and 16 being simultaneously operated via the switching signal 19 or 20. The switching signals 17 and 18 are inverse with respect to each other, likewise as 19 and 20.

When the switching signal 17 is present at the switches 13 and 14, the slope inverter 9 is switched in phase with the ring inverter 1 and, simultaneously, the slope inverter 11 is switched in phase with the ring inverter 3. Independent of this, the signal 19 may be simultaneously or not simultaneously present at the switches 15 and 16 so that the slope inverters 10 and 12 are switched in phase with the respective ring inverters 2 and 4. When the signal 18 is present at the switches 13 and 14, the slope inverter 11 is switched in anti-phase with the ring inverter 1 and the slope inverter 9 is switched in anti-phase with the ring inverter 3. When the signal 20 is present at the switch 16, the slope inverter 12 is switched in anti-phase with the ring inverter 2, and since the switch 15 simultaneously receives this signal 20, the slope inverter 10 is switched in anti-phase with the ring inverter 4.

FIG. 1 shows that the same number of inverters is always operated in this circuit arrangement so that the switch-over from in-phase to anti-phase operation does not become manifest by a change of the current consumption.

The channel width ratio of the transistors in the slope inverters and the ring inverters determines the achievable frequency change. When all slope inverter pairs have, for example, an equal channel width ratio of 1:2 with respect to the associated ring inverter pairs, the frequency is either increased or reduced, dependent on the mode of operation, because the slope inverters have a different steepness than the ring inverters. In this embodiment, three different frequencies can be adjusted. When the frequency of the combination of the "in-phase" switched slope inverter pair 9 and 11 and the other "anti-phase" switched slope inverter pair 10 and 12 is considered as a medium frequency, this frequency is halved when the slope inverters 9 and 11 are also switched in anti-phase with the ring inverters 1 and 3, because the resultant steepness or slope of the signal becomes smaller due to the negative feedback at the signal points 24 and 26. In this above-mentioned combination, a switch-over of the second slope inverter pair 10, 12 to the first "in-phase" mode results in an increase of the medium frequency by 1.5 so that, overall, a triplication of a fundamental frequency at which all slope inverters are switched in phase opposition is possible in a four-phase oscillator. If the channel width ratio of the slope inverters 9 and 11 with respect to the ring inverters 1 and 3 is different from the channel width ratio of the slope inverters 10 and 12 with respect to the ring inverters 2 and 4, four different frequencies can be adjusted, because the frequency in the case of operation of the slope inverters 9 and 11 in the first mode is different from the frequency in the case of operation of the slope inverters 10 and 12 in the first mode.

Figure 2:
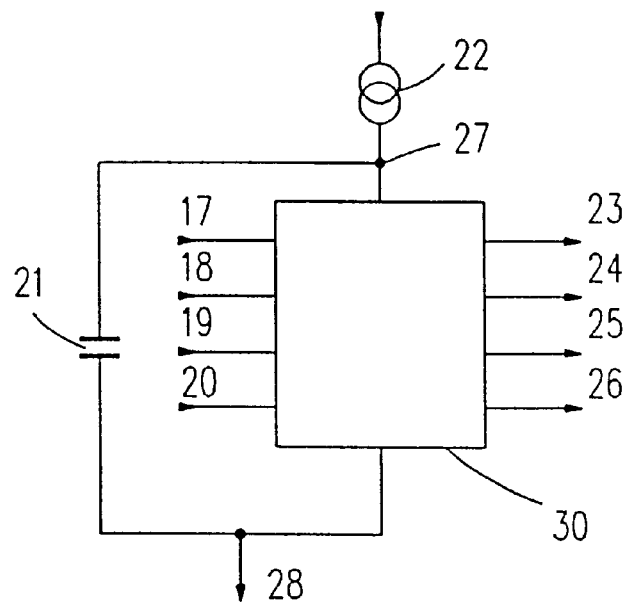
FIG. 2 shows the exterior circuitry and the current supply for a four-phase ring oscillator.

FIG. 2 shows the external circuitry for a ring oscillator 30. The ring oscillator 30 is operated via a current source 22. By means of the high-ohmic current source 22, a voltage is generated at the point 27 which is present via an anti-interference capacitor 21 and the internal resistance of the oscillator 30. Consequently, the voltage at point 27 follows a reference potential 28 so that an interference voltage, with which the reference potential 28 may be modulated, does not have any influence on the frequency of the ring oscillator.

The signals 17 and 18, 19 and 20 are applied to the switches (13, 14, 15, 16 in FIG. 1) in the ring oscillator 30 from a digital circuit (not shown). The signals 23, 24, 25, 26 represent the signal points of the ring oscillator 30, from which the adjusted frequency, shifted 90° in phase, is derived.

Figure 3:
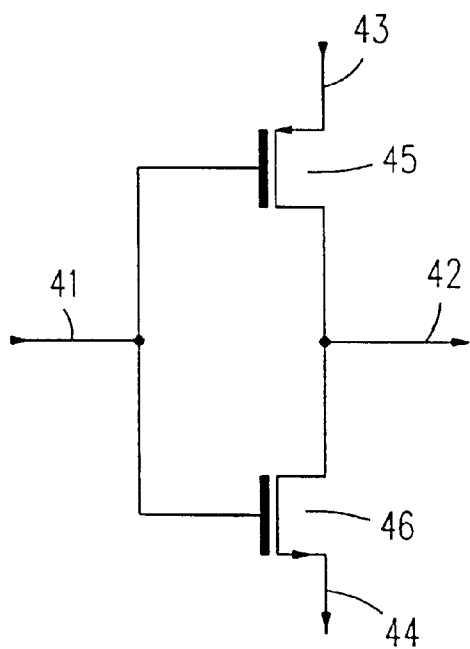
FIG. 3 shows the general structure of an inverter used in the circuit arrangement.

FIG. 3 shows an inverter cell as used for the three types of inverters, consisting of a p-channel MOSFET 45 and a n-channel MOSFET 46, with a reference potential 44 and a power supply voltage 43. Dependent on the level, one of the two transistors 45, 46 is turned on via an input 41, so that an output 42 is brought to an opposite potential and thus supplies a negated signal.

The transistors, for example, 45 and 46, used in the individual inverters have different channel widths so as to maintain the steepness of the n and p-channel transistors possibly equal and thus generate a symmetrical switching point for the inverter.

Figure 4:
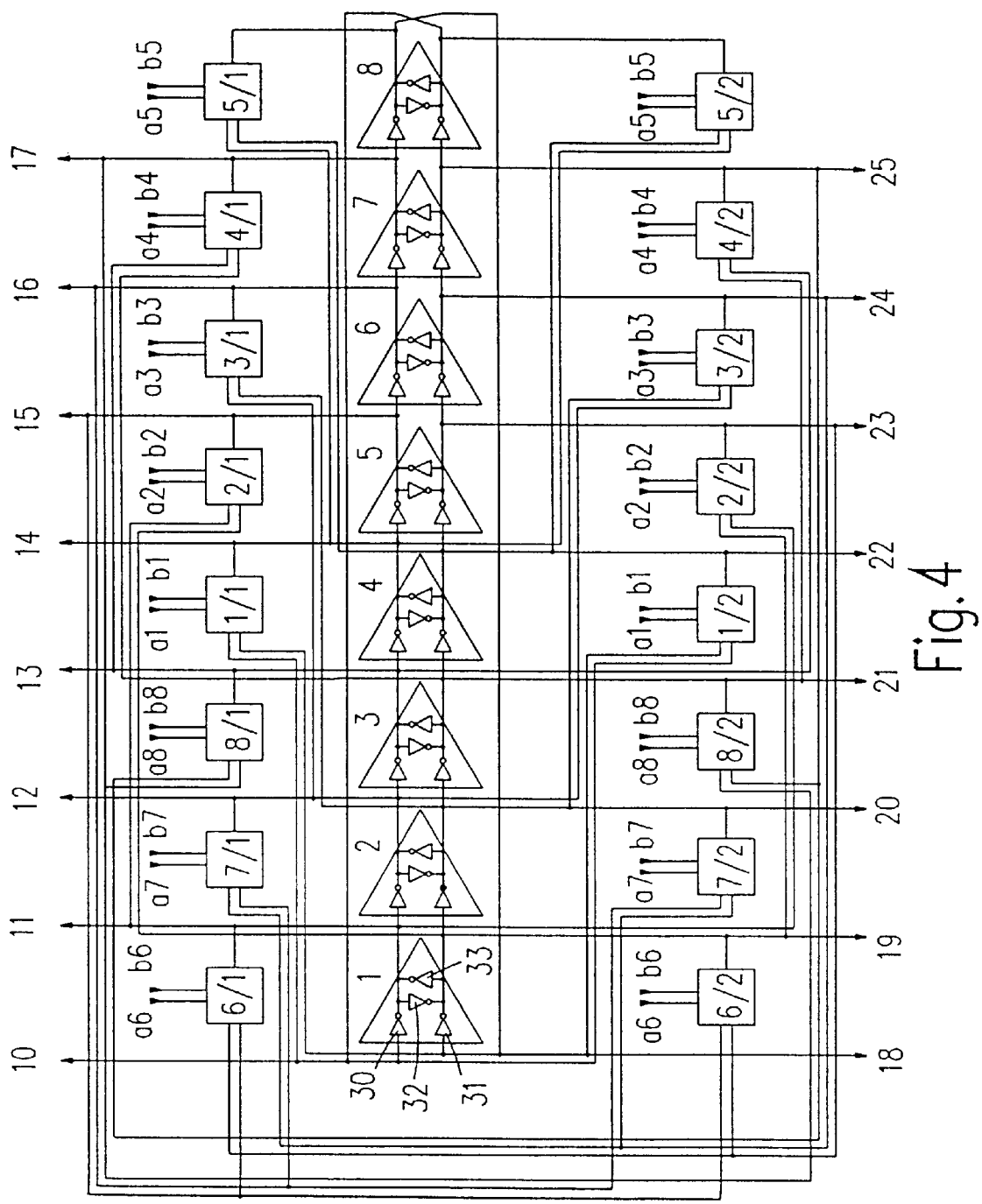
FIG. 4 shows a circuit arrangement of a sixteen-phase ring oscillator.

FIG. 4 shows a circuit arrangement for a sixteen-phase ring oscillator in which the pair-wise ring inverters are combined in blocks 1–8 with the associated shunt inverter pairs.

This sixteen-phase oscillator has sixteen signal points 10–25 at which the phase-shifted frequencies are present with a phase shift of 22.5° between consecutive signal points. Slope inverters n/1, n/2, in which n=(1 . . . 8) are pair-wise assigned to a block n and are controlled via switching signals a1 . . . a8 for the first mode and b1 . . . b8 for the second mode, the switching signals a1 . . . a8 and b1 . . . b8 being inverse with respect to each other and being externally applied to the ring oscillator.

To switch a slope inverter with the switching signal a in phase, the output of the slope inverter is connected to the fourth following signal point because the signal is positively shifted 90° in phase at this point. For the phase opposition mode, which is adjustable by means of the switching signal b, the slope inverter is connected in the opposite direction to a signal point which is located four signal points before the signal point of the input of the slope inverter so as to achieve the 90° negative phase shift.

This will be elucidated with reference to FIG. 4 for one possibility. The block 1 comprises two ring inverters 30, 31 and the assigned shunt inverters 32, 33. Signal point 10 is the input for ring inverter 30. The slope inverter 1/1 is switched in phase with the ring inverter 30 in block 1 by means of the switching signal a1, and simultaneously, the slope inverter 1/2 is switched in phase with the ring inverter 31 at signal point 18 by means of the same switching signal a1. The signal from slope inverter 1/1 is coupled into the signal point 14 because at this point, i.e., four signal points further, the signal is present with a 90° phase shift because each block only effects a 22.5° phase shift. Similarly, the signal from slope inverter 1/2 is first coupled into the signal point 22. For the phase opposition mode, starting from signal point 10 via the slope inverter 1/2, the signal is coupled into the signal point 22 which, with respect to the signal point 10, conveys a signal having a negative phase shift of 90°. The input of ring inverter 31, signal point 18, is connected to the slope inverter 1/1 in the anti-phase mode, because its output, signal point 14, has a negative phase shift of 90° with respect to signal point 18.

Based on the same principle as that for the four-phase ring oscillator of FIG. 1, the same number of inverters is always active in this ring oscillator, so that, also in this case, there is no change of current consumption. The pair-wise "in-phase" switching of the slope inverters increases the frequency. When all eight pairs of the slope inverters are switched in phase, the highest frequency is achievable. When all slope inverters are switched in anti-phase, the smallest frequency is achievable. By switching some slope inverter pairs, intermediate frequencies are achieved. It is possible to adjust 9 different frequencies with the 16-phase oscillator, at the same channel width ratios of the ring inverters of the blocks 1–8 with respect to the assigned slope inverters. If all channel width ratios of the ring inverters in the blocks 1–8 with respect to the assigned slope inverters are different, $2^8$ different frequencies can be adjusted.

Different frequencies are achieved by statically switching the slope inverter pairs in one of the "in-phase" or "anti-phase" modes. When a slope inverter pair is clocked in that the switches preceding the selected slope inverters of a pair are switched alternately between the two modes at a corresponding frequency, for example, at half the oscillator frequency, it is achieved that both slope inverters are "in-phase" for two clock edges and "anti-phase" for the subsequent two clock edges. This leads to a mean oscillator frequency which is between the frequencies that are achieved when the slope inverter pair is statically arranged "in-phase" or "anti-phase".

I claim:

1. A ring oscillator comprising:

an even number of ring inverter pairs combined to a ring, in which an input of each individual ring inverter conveys a phase-shifted signal at a signal point, a phase shift with respect to the signal at a previous signal point results from a quotient of 360° by the number of ring inverters, and the ring inverters, whose input signals are phase-shifted by 180° with respect to each other, constitute a ring inverter pair;

the same even number of shunt inverter pairs, in which each shunt inverter pair is assigned to a ring inverter pair and the assigned shunt inverter pair feeds back output signals of the ring inverters to the respective other output of the ring inverter associated with the pair; and the same even number of slope inverter pairs, in which each slope inverter pair is assigned to a pair of ring inverters and to the signal points constituting their inputs, the inputs of the slope inverters being alternately connected in two modes to a respective one of said signal points, and the outputs of the slope inverters being fixedly connected to signal points which, with reference to the signal points at the input of each slope inverter, have a phase shift of 90°, wherein, in one of the modes, referred to as "in-phase", a phase shift of 90° in a positive (leading) direction occurs between the input and the output of each slope inverter, and wherein, in a second mode, referred to as "anti-phase", a phase shift of 90° occurs in a negative (lagging) direction between the input and the output of each slope inverter.

2. A ring oscillator as claimed in claim 1, characterized in that frequencies produced by the ring oscillator are dependent on channel width ratios of transistors in the ring inverters and the slope inverters.

3. A ring oscillator as claimed in claim 1, characterized in that said ring oscillator further comprises a switch coupled to the input of each of the slope inverters for alternatively connecting said input in said two modes to said respective one of said signal points.

4. A ring oscillator as claimed in claim 1, characterized in that the ring oscillator is fed by a current source.

5. A ring oscillator as claimed in claim 1, characterized in that said ring oscillator further comprises switches pairwise selectable for slope inverter pairs and switchable at a frequency between the two modes.

* * * * *